United States Patent
Chen (10) Patent No.: US 10,420,420 B2
(45) Date of Patent: Sep. 24, 2019

(54) SLIDE RAIL BRACKET

(71) Applicant: MARTAS PRECISION SLIDE CO., LTD., New Taipei (TW)

(72) Inventor: Wan-Lai Chen, New Taipei (TW)

(73) Assignee: MARTAS PRECISION SLIDE CO., LTD., New Taipei (TW)

( * ) Notice: Subject to any disclaimer, the term of this patent is extended or adjusted under 35 U.S.C. 154(b) by 0 days.

(21) Appl. No.: 16/140,073

(22) Filed: Sep. 24, 2018

(65) Prior Publication Data

US 2019/0104846 A1 Apr. 11, 2019

(30) Foreign Application Priority Data

Oct. 11, 2017 (TW) .............................. 106134749 A (51) Int. Cl.
| | |
|---|---|
| *A47B 88/43* | (2017.01) |
| *A47B 88/483* | (2017.01) |
| *H05K 7/14* | (2006.01) |
| *A47B 96/14* | (2006.01) |

(52) U.S. Cl.
CPC ............ *A47B 88/43* (2017.01); *A47B 88/483* (2017.01); *H05K 7/1489* (2013.01); *A47B 96/1441* (2013.01); *A47B 2210/09* (2013.01)

(58) Field of Classification Search
CPC ..... A47B 88/43; A47B 88/407; A47B 88/423; A47B 88/427; A47B 2088/4235; A47B 2088/4278; A47B 2210/09; A47B 96/068; A47B 96/067
See application file for complete search history.

(56) References Cited

U.S. PATENT DOCUMENTS

| | | | | |
|---|---|---|---|---|
| 8,870,311 | B2 * | 10/2014 | Chang .................. | H05K 7/1489 312/334.4 |
| 9,363,921 | B1 * | 6/2016 | Chen .................... | H05K 7/1489 |
| 9,532,483 | B1 * | 12/2016 | Chang .................. | F16B 2/12 |
| 9,723,924 | B1 * | 8/2017 | Chiu ..................... | A47B 88/43 |
| 2009/0250421 | A1 * | 10/2009 | Wang .................... | G06F 1/183 211/183 |
| 2014/0117180 | A1 * | 5/2014 | Chen .................... | H05K 7/1489 248/219.1 |
| 2014/0363109 | A1 * | 12/2014 | Chen .................... | A47B 88/43 384/22 |
| 2015/0048041 | A1 * | 2/2015 | Chuang ................ | H05K 7/1489 211/175 |
| 2016/0309607 | A1 * | 10/2016 | Hsu ...................... | H05K 7/1489 |
| 2017/0055707 | A1 * | 3/2017 | Chen .................... | A47B 88/407 |

(Continued)

*Primary Examiner* — Daniel J Rohrhoff
(74) *Attorney, Agent, or Firm* — Li & Cai Intellectual Property (USA) Office (57) ABSTRACT

A slide rail bracket includes a main body and a slide component. The main body has an accommodating portion inside, and the front end of the main body is provided with two through holes. The slide component has a slide block and two positioning bolts. The slide block is slidably disposed in the accommodating portion, and the two positioning bolts are disposed on the front end of the slide block and respectively penetrate into the two through holes. The front ends of two positioning bolts respectively have a first diameter portion and a second diameter portion. The first diameter portion and the second diameter portion are arranged coaxial with each other, and the first diameter portion is disposed at the front end of the second diameter portion.

10 Claims, 11 Drawing Sheets (56) References Cited

U.S. PATENT DOCUMENTS

| | | | |
|---|---|---|---|
| 2017/0354055 A1* | 12/2017 | Hsu | H05K 7/1489 |
| 2018/0199712 A1* | 7/2018 | Chen | A47B 88/43 |
| 2018/0220797 A1* | 8/2018 | Chen | A47B 88/423 |

* cited by examiner

SLIDE RAIL BRACKET

CROSS-REFERENCE TO RELATED PATENT APPLICATION

This application claims the benefit of priority to Taiwan Patent Application No. 106134749, filed on Oct. 11, 2017. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a slide rail bracket, and more particularly to a slide rail bracket used in a slide rail such as a drawer slide rail or a server slide rail for installing a slide rail on a rack column of a rack.

BACKGROUND OF THE DISCLOSURE

With the advantages of having smooth movements and stable structures, roller slide rails are widely used in cabinets, system furniture, server cabinets, display brackets and slide racks of other electronic products. In order to facilitate installation of the slide rail on the rack column of the cabinet, the conventional slide rail is usually provided with a bracket at both ends with the two ends of the slide rail being fixedly positioned on the rack column by the bracket.

Most of the conventional slide rail brackets are provided with two positioning pins at the front end of the main body of the bracket, and the two positioning pins can be engaged in the positioning holes arranged in a row on the rack column, thereby fixedly positioning the bracket on the rack column. However, since there is a wide variety of racks on the market and the dimensions of column positioning holes used in racks of different brands also differ in size, when the slide rail brackets are used in the rack columns with different specifications, different positioning pins need to be applied.

In order to overcome the above issues, some slide rail brackets on the market use positioning bolts with two different diameters so that the slide rail brackets can be used with columns having positioning holes of different sizes at the same time. While the positioning bolt of this kind of slide rail bracket can be quickly engaged in the positioning hole of the rack column when assembling the bracket on the rack, the positioning bolt cannot be smoothly withdrawn from the positioning hole of the rack column when disassembling the bracket from the rack. Tools may need to be further used to withdraw the positioning bolt from the positioning hole so that the bracket can be removed from the rack column, which causes inconvenience in use.

In addition, the conventional slide rail bracket is not equipped with a buckle device for a locking device of the slide rail. Therefore, when the slide rail with the locking device is used, an additional buckle device is also required, which causes inconvenience in use.

Based on the above, it has become an important issue in the art to solve the above problems through improvements in the structure of the slide rail bracket.

SUMMARY OF THE DISCLOSURE

An object of the present disclosure is to provide a slide rail bracket which can be quickly installed or disassembled without using tools during installation or disassembly. Another object of the present disclosure is to provide a slide rail bracket which can be used with racks of different specifications and can be used in a slide rail locking device.

The present disclosure provides a slide rail bracket used to be installed on a slide rail to fix the slide rail to a rack column of a rack. The slide rail bracket includes: a main body and a slide component. The main body has a front end, a rear end, an accommodating portion provided inside the main body, two through holes disposed at the front end of the main body, the two through holes being parallel to each other and extending from the front end of the main body to the accommodating portion. A slide component includes a slide block and two positioning bolts. The slide block is slidably disposed in the accommodating portion and is slidable back and forth along a direction parallel to the two through holes; the two positioning bolts are disposed on the front end of the slide block and respectively penetrate into the two through holes. When the slide block is displaced near the front end of the main body, the two positioning bolts protrude from the outer side of the front end of the main body. A first diameter portion and a second diameter portion are respectively provided at the front end of the two positioning bolts. The first diameter portion and the second diameter portion are coaxial with each other, the diameter of first diameter portion is smaller than the diameter of second diameter portion, and the first diameter portion is disposed at the front end of second diameter portion. At least one elastic member is disposed between the accommodating portion and the slide block, and used to push the slide block to displace toward the front of the main body.

The beneficial effect is that the slide rail bracket of the present disclosure can be applied to rack columns having positioning holes of different sizes at the same time without the need for tools during installation and disassembly, so that the convenience of use can be effectively improved.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 1:
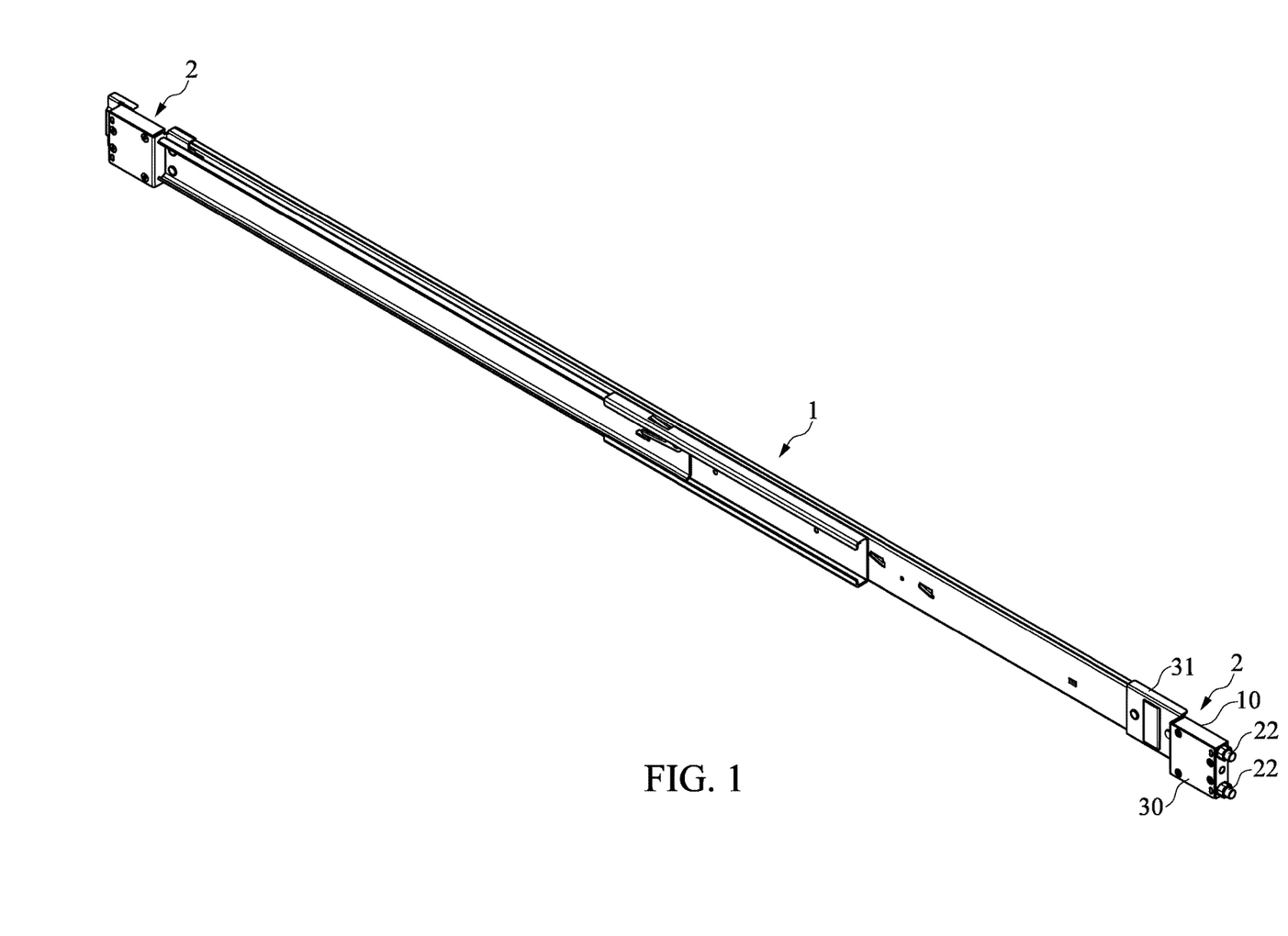
FIG. 1 is an assembled perspective view of a slide rail bracket assembled at the front and rear ends of a slide rail according to the present disclosure.

Referring to FIG. 1, the present disclosure provides a slide rail bracket 2 to be installed at the two ends of a slide rail 1. By the slide rail bracket 2, the slide rail 1 may be quickly disassembled or installed on a rack column of a rack.

Figure 2:
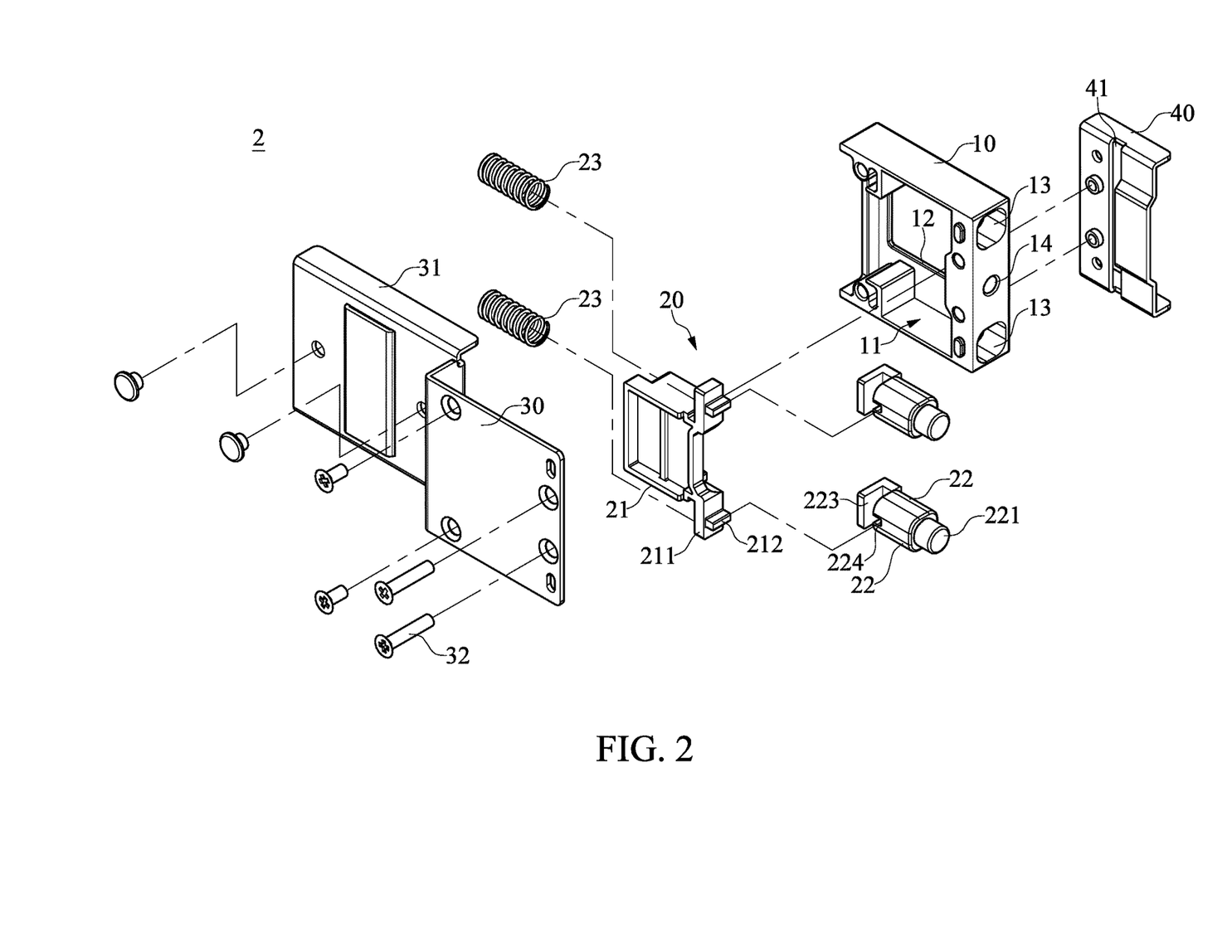
FIG. 2 is an exploded perspective view of the slide rail bracket according to the present disclosure.
Figure 3:
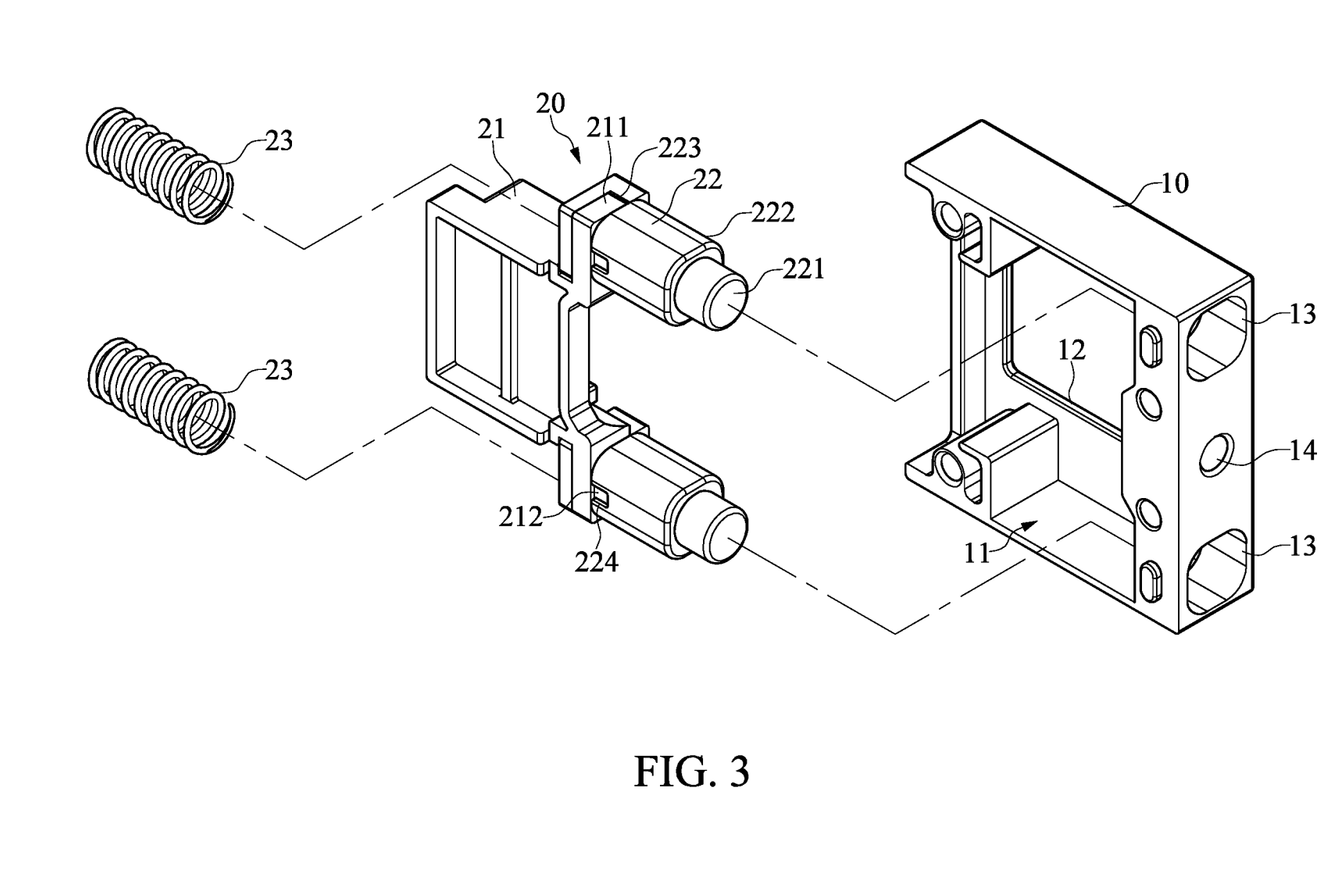
FIG. 3 is a partial exploded view of a main body and a slide component used in the slide rail bracket according to the present disclosure.
Figure 4:
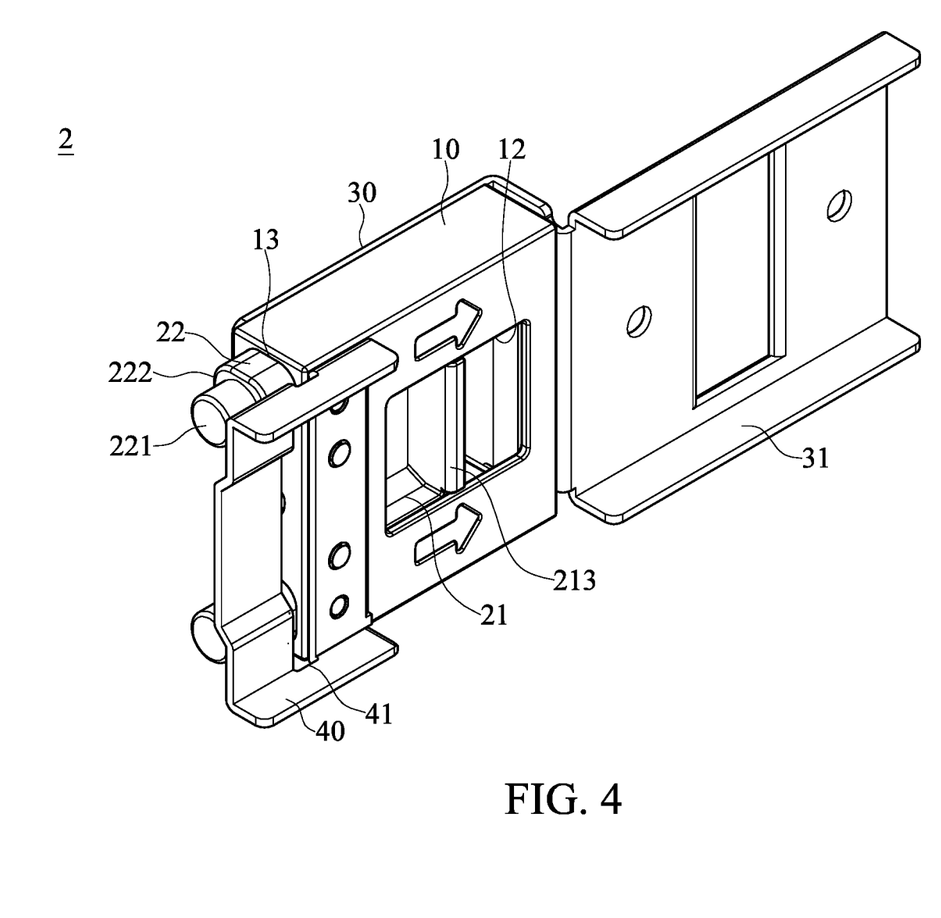
FIG. 4 is an assembled perspective view of the slide rail bracket according to the present disclosure.

Referring to FIG. 2 to FIG. 4, the slide rail bracket 2 of the present disclosure mainly includes: a main body 10, a slide component 20, two elastic members 23 disposed between the main body 10 and the slide component 20, a cover plate 30 and a connecting seat 31 disposed on a side surface of the main body 10.

Referring to FIG. 2 and FIG. 3, the main body 10 in this embodiment is substantially rectangular. An accommodating portion 11 is provided inside the main body 10, and two through holes 13 are disposed at the front end of the main body 10. The two through holes 13 are parallel to each other and extend from the front end of the main body 10 to the accommodating portion 11. A locking bolt hole 14 is defined between the two through holes 13 at the front side surface of the main body 10. The locking bolt hole 14 is to allow a movable inner rail of the slide rail 1 to be locked into the locking bolt hole 14 by a screw, so as to fixedly position the movable inner rail of the slide rail 1. In addition to being used to fixedly position the movable inner rail of the slide rail 1, the locking bolt hole 14 also allows a server rack on the slide rail 1 to be locked into the locking bolt hole 14 through a screw so as to fixedly position the server.

Since a side surface of the accommodating portion 11 of the main body 10 is open, the slide component 20 and the two elastic members 23 can be disposed in the accommodating portion 11 of the main body 10 from the open side of the accommodating portion 11. The cover plate 30 is fixed to the main body 10 corresponding to the open side of the accommodating portion 11 by screws, so as to close the open side surface of the accommodating portion 11 and limit the slide component 20 and the two elastic members 23 in the accommodating portion 11. In this embodiment, the cover plate 30 is made of a metal plate, and the rear end of the cover plate 30 is connected to a connecting seat 31. The shape of connecting seat 31 complements that of the front or rear end of the slide rail 1 and can be fixedly connected with the front or rear end of the slide rail 1 so as to install the slide rail bracket 2 of the present disclosure on the front or rear end of the slide rail 1 (as shown in FIG. 1).

Referring to FIG. 2 and FIG. 3, the slide component 20 is slidably disposed on the main body 10 and includes a slide block 21 and two positioning bolts 22. The slide block 21 is slidably disposed in the accommodating portion 11 and is slidable back and forth along a direction parallel to the two through holes 13. The two positioning bolts 22 are disposed on two sides of the front end of the slide block 21 and respectively penetrate into the two through holes 13. Therefore, the two positioning bolts 22 can move back and forth along the slide block 21 and are retractably accommodated in the two through holes 13.

Figure 5:
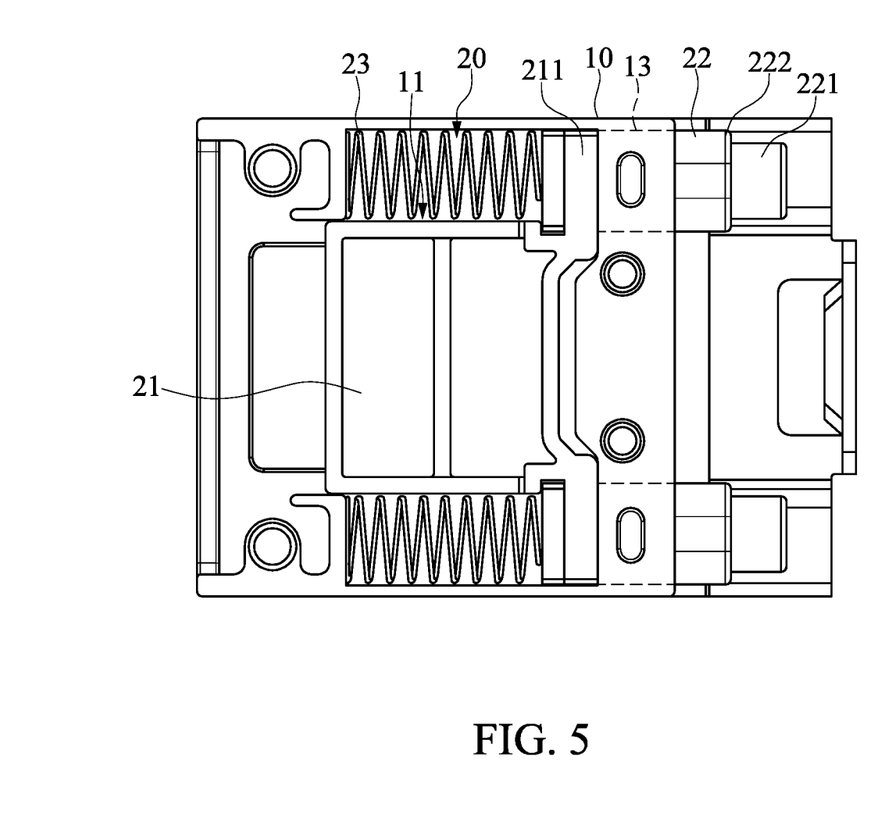
FIG. 5 and FIG. 6 are schematic views of the slide rail bracket according to the present disclosure in operation.
Figure 6:
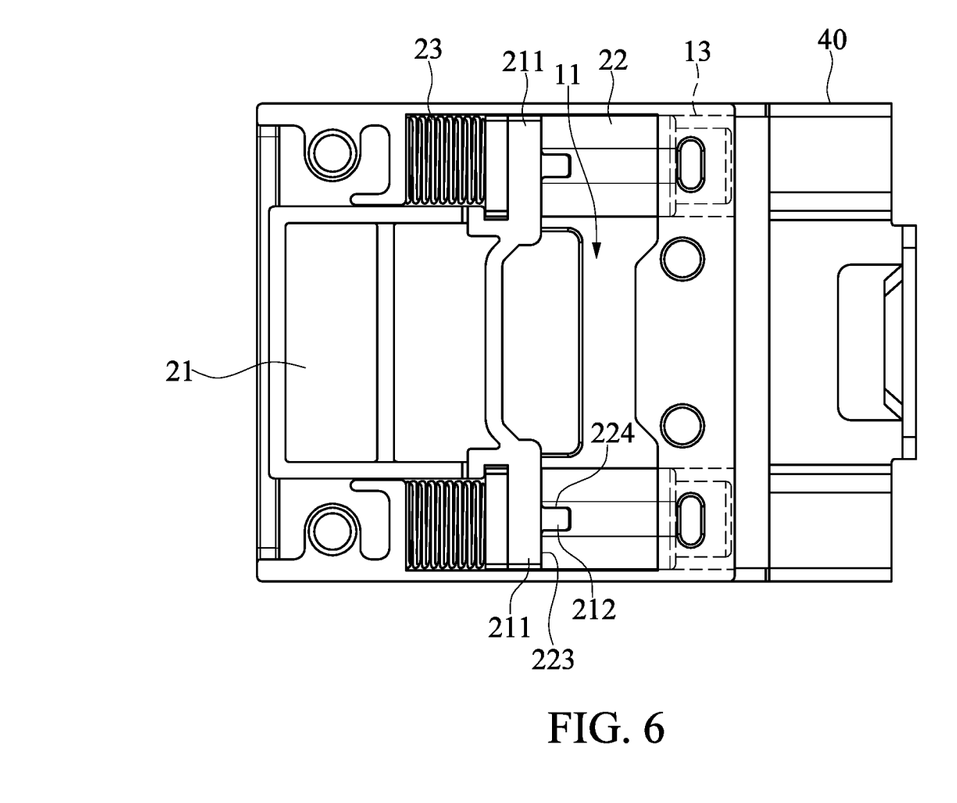
Figure 7A:
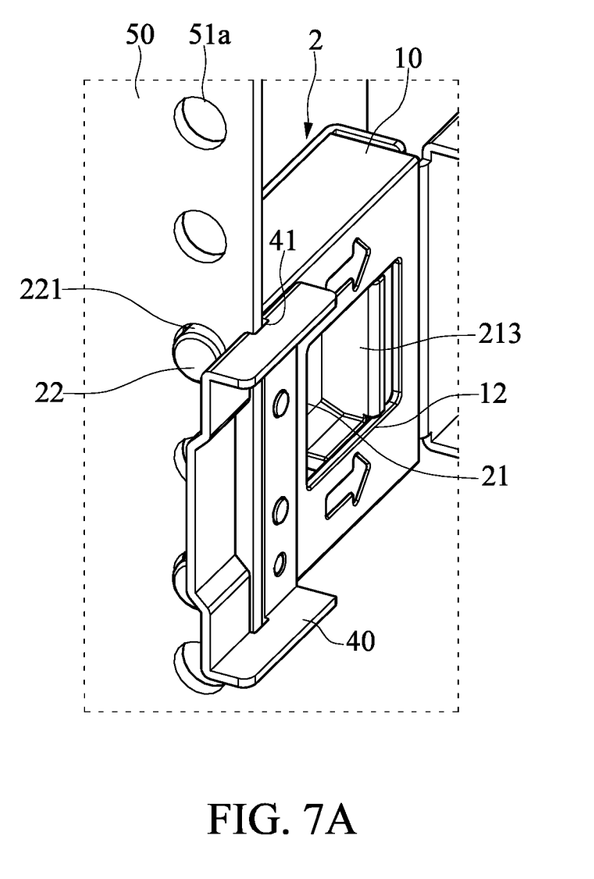
FIG. 7A and FIG. 7B are schematic views respectively showing the slide rail bracket according to the present disclosure installed on rack columns with positioning holes of different sizes and in use.
Figure 7B:
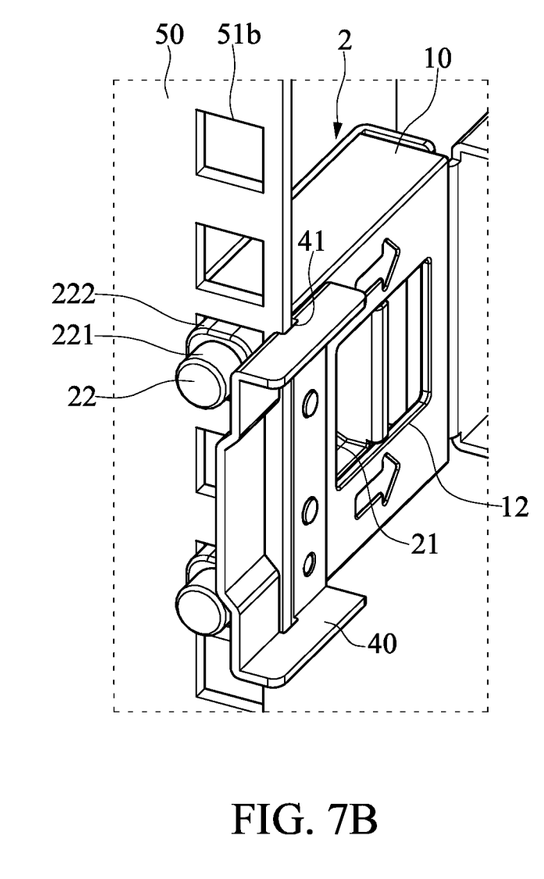
Figure 8A:
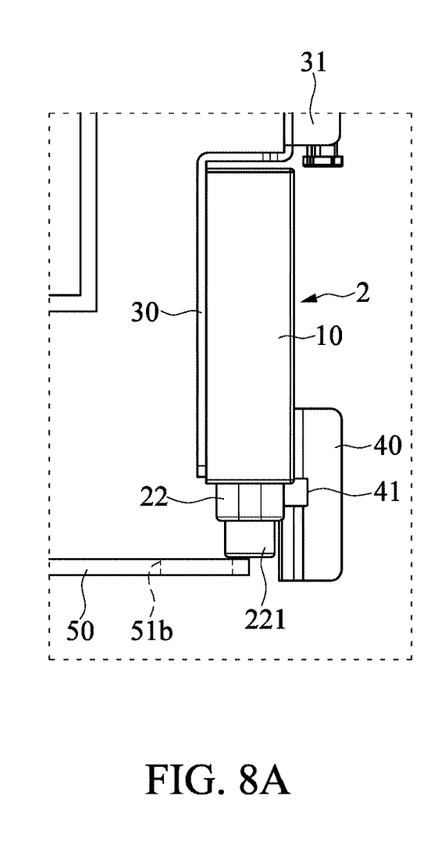
FIG. 8A to FIG. 8C are schematic views showing sequential operating procedures of the slide rail bracket assembled with a rack column according to the present disclosure.
Figure 8B:
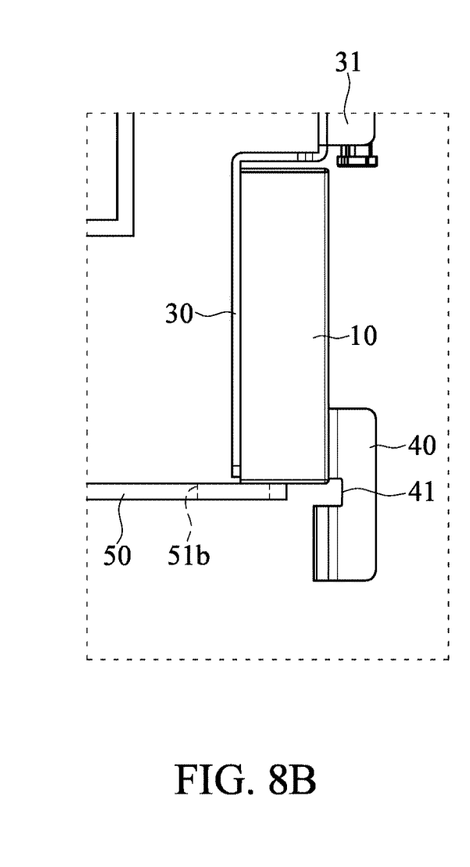
Figure 8C:
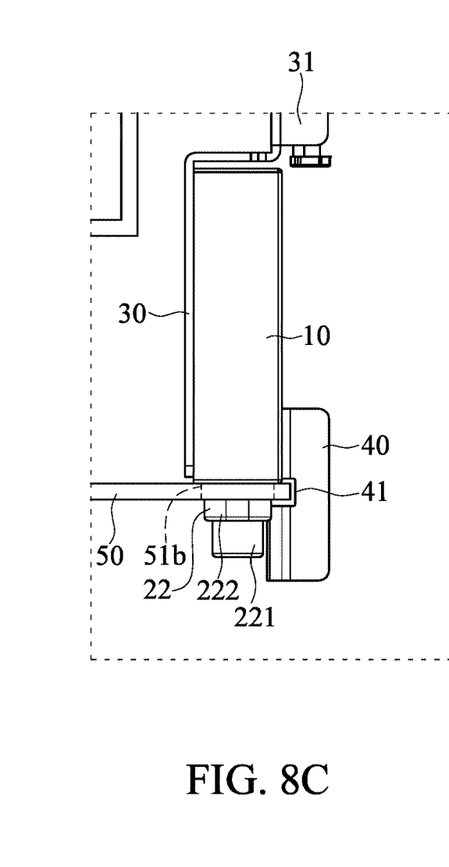

In this embodiment, the slide block 21 complements the accommodating portion 11 in shape. The slide block 21 is restrained and guided by an inner side wall of the accommodating portion 11 so that the slide block 21 can move back and forth along a direction parallel to a central axis of the two through holes 13. Referring to FIG. 5, FIG. 6 and FIG. 7, FIG. 8, when the slide block 21 moves back and forth in the accommodating portion 11, the two positioning bolts 22 are also driven to move by the slide block 21. When the slide block 21 moves near the front end of the accommodating portion 11, the two positioning bolts 22 protrude from the front end of the main body 10 (as shown in FIG. 5 and FIG. 7). When the slide block 21 moves near the rear end of the accommodating portion 11, the two positioning bolts 22 are guided by the slide block 21 and retract to the inner side of the main body 10 (as shown in FIG. 6 and FIG. 8).

Referring to FIG. 3, FIG. 5 and FIG. 6, when the slide block 21 is assembled in the accommodating portion 11, two spaces are reserved in the accommodating portion 11 respectively at two sides of the slide block 21. The two elastic members 23 are respectively disposed in the two spaces. In this embodiment, the two elastic members 23 are coil springs, and two ends of the two elastic members 23 respectively disposed between and in contact with the inner side wall of the accommodating portion 11 and rear side surfaces of the two positioning bolts 22. Through the elasticity of the two members 23, the slide block 21 and two positioning 22 are pushed so that the two positioning bolts 22 remain protruding from the outer side of the main body 10.

Referring to FIG. 4, a toggle portion 213 is provided on a side surface of the slide block 21 opposite to the cover plate 30, an opening portion 12 is disposed on a side surface of the main body 10 corresponding to the cover plate 30. The toggle portion 213 corresponds in position to the opening portion 12 of the main body 10, and the toggle side 213 is exposed from the opening portion 12. The function of the toggle portion 213 is to enable a user to toggle the toggle portion 213 with a finger so that an operator can control the slide block 21 and the two positioning bolts 22 to move back by pushing the toggle portion 213 toward the rear end of the main body 10; therefore, the two positioning blots 22 are retracted into the inner side of the main body 10.

Referring to FIG. 2 and FIG. 3, in this embodiment of the present disclosure, two sides of the front end of the slide block 21 respectively have a connecting plate 211. The direction of two connecting plates 211 is substantially perpendicular to the two positioning bolts 22. The rear ends of the two positioning bolts 22 are respectively provided with a connecting slot 223. The widths of two connecting slots 223 complement the two connecting plates 211 so that the two connecting plates 211 engage in the two connecting slots 223, thereby combining the two positioning bolts 22 on the connecting plates 211 at two sides of the front end of the slide block 21. In this embodiment, a positioning slot 224 is further disposed on one of inner side walls in the connecting slots 223 of the two positioning bolts 22. The two positioning slots 224 and the two connecting slots 223 extend in directions perpendicular to each other. At the same time, a positioning portion 212 is respectively disposed on the two connecting plates 211 corresponding to the positions of two positioning slots 224. The two positioning slots 224 complement the two positioning portions 212 in shape, and when the two connecting slots 223 are engaged with the two connecting plates 211, the two positioning portions 212 are engaged in the two positioning slots 224.

When the two positioning bolts 22 are assembled on the two connecting plates 211 of the slide block 21, the operation of the two positioning portions 212 and the two positioning slots 224 can block the movement of the two connecting slots 223 and the two connecting plates 211 along a direction perpendicular to the two positioning bolts 22, so as to prevent the two connecting plates 211 from being disengaged from the two connecting slots 223.

It should be noted that in this embodiment, the two positioning bolts 22 of the slide component 20 are separate structures from the slide block 21. However, in other embodiments, the two positioning bolts 22 may be integrally formed with the slide block 21, and is not limited to the disclosed structure in this embodiment.

Referring to FIG. 3, FIG. 4 and FIG. 7A and FIG. 7B, the front ends of the two positioning bolts 22 form a first diameter portion 221 and a second diameter portion 222. The first diameter portion 221 and the second diameter portion 222 are coaxial with each other. The first diameter portion 221 is protrudingly disposed on the surface of front end of the second diameter portion 222. The diameter of first diameter portion 221 is smaller than the diameter of second diameter portion 222.

Referring to FIG. 7A and FIG. 7B, the first diameter portion 221 and the second diameter portion 222 at the front end of the positioning bolt 22 respectively cooperate with a positioning hole 51a or 51b of a rack column 50 to fixedly position the slide rail bracket 2 onto the rack column 50. In this embodiment, since the outer diameter of the first diameter portion 221 is cylindrical, the first diameter portion 221 can complement the circular positioning hole 51a having a small diameter. Since the diameter of the second diameter portion 222 is larger than the diameter of the first diameter portion 221, the second diameter 222 can complement the square positioning hole 51b having a larger diameter. Since the front ends of the two positioning bolts 22 simultaneously have the first diameter portion 221 and the second diameter portion 222 complementing the positioning hole 51a or 52b of different specifications, it is unnecessary to change the positioning bolt 22 of the slide rail bracket 2 of the present disclosure when the slide rail bracket 2 is assembled on rack columns of different specifications, thereby improving the convenience of use.

Further, in the slide rail bracket 2 of the present disclosure, a buckle component 40 is disposed at a side surface of the main body 10. Referring to FIG. 4, FIG. 7A and FIG. 7B, the buckle component 40 is disposed at a side surface of the main body 10 and extends beyond the front end of the main body 10. A buckle slot 41 is disposed at a side surface of the buckle component 40 facing the rack column 50 and corresponds in position to the rack column 50. The buckle slot 41 engages with an edge of a side surface of the rack column 50 facing the buckle component 40 when the slide rail bracket 2 is assembled on the rack column 50, thereby fixedly positioning the main body 10 of slide rail bracket 2 onto the rack column 50.

Referring to FIG. 8A to FIG. 8C, during the installation of the slide rail bracket 2 and the buckle component 40 onto the rack column 50, first, the positioning bolts 22 of the slide rail bracket 2 are abut against the rear side surface of the rack column 50; then, an operator pushes the main body 10 of the slide rail bracket 2 toward the rack column 50 so that the front end of the main body 10 abuts against the rear side surface of the rack column 50, and the two positioning bolts 22 retract back to the inside of the main body 10. Then, the main body 10 is pushed near the rack column 50 so that the buckle slot 41 on the buckle component 40 engages with the edge of the rack column 50. Then, the main body 10 is moved up and down such that the centers of the two positioning bolts 22 are aligned with the positioning hole 51a or 51b of the rack column 50, and the two positioning bolts 22 can be pushed by the elastic force of the elastic member 23 so that the first diameter portion 221 or the second diameter portion 222 of the front end thereof can be engaged into the positioning hole 51a or 51b.

After the buckle slot 41 of the buckle component 40 engages with the edge of the rack column 50, the main body 10 is fixedly positioned against the rear side surface of the rack column 50, such that the slide rail bracket 2 and the rack column 50 cannot be displaced back and forth to prevent the two positioning bolts 22 from being disengaged from the positioning hole 51a or 51b of the rack column 50 due to unexpected back and forth movement. Therefore, the slide rail bracket 2 can be firmly assembled on the rack column 50.

Figure 9:
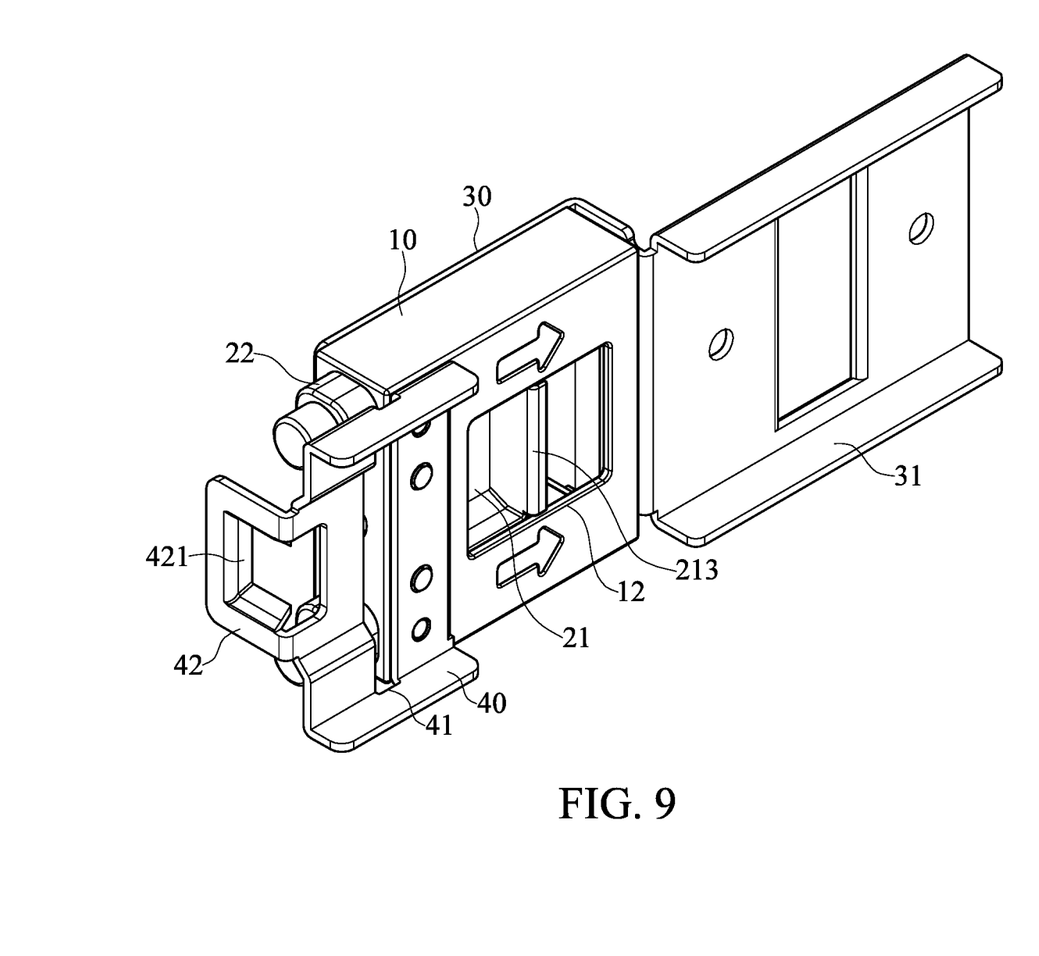
FIG. 9 is an assembled perspective view of a specific embodiment of the slide rail bracket implementing another buckle component according to the present disclosure.
Figure 10:
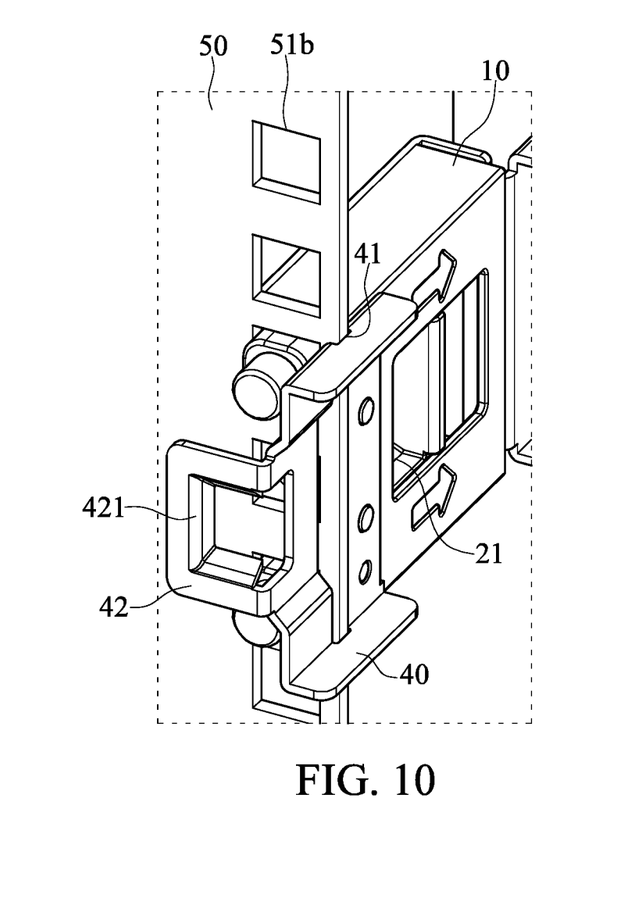
FIG. 10 is a schematic view showing a use state in the specific embodiment of the slide rail bracket implementing another buckle component according to the present disclosure.
Figure 11A:
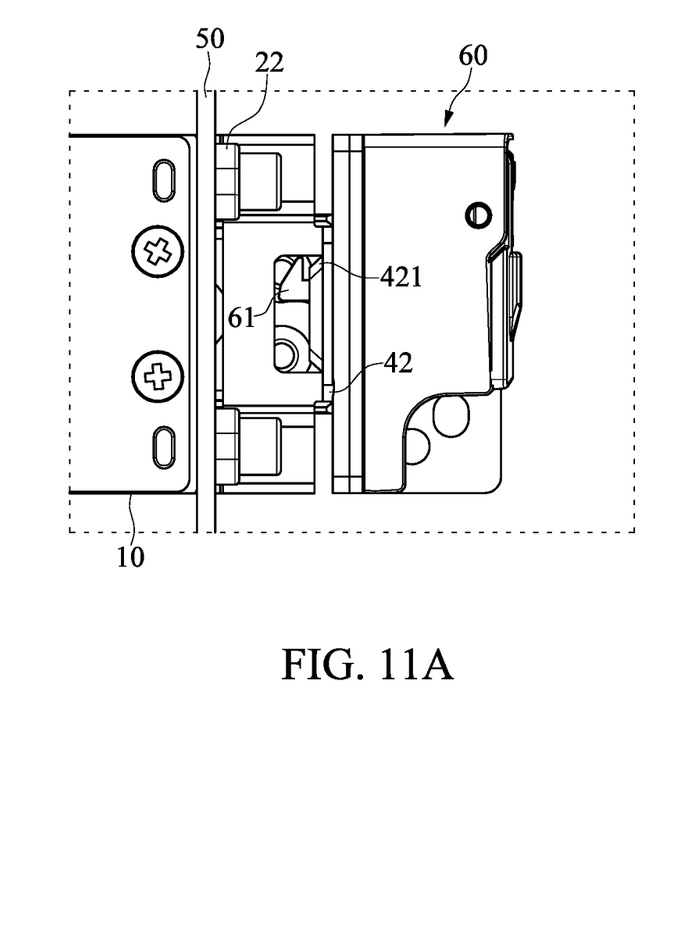
FIG. 11A and FIG. 11B are schematic views showing a use state of the slide rail bracket implementing another buckle component with a slide rail locking device according to the present disclosure.
Figure 11B:
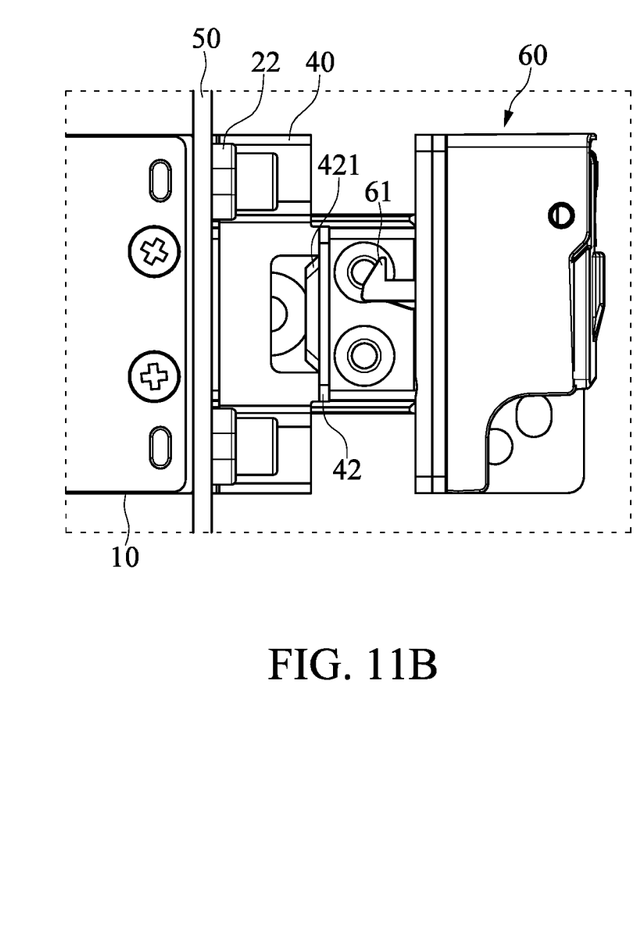

One of the features of the present disclosure is that, the buckle component 40 is detachably assembled on the main body 10, and the buckle component 40 can be changed depending on different slide rail positioning structures. Referring to FIG. 9 and FIG. 10, the slide rail bracket 2 according to an embodiment of the present disclosure implements another buckle component 40 with another structure. In this embodiment, the buckle component 40 is further disposed with a fastening plate 42. The fastening plate 42 is connected to the front end of the buckle component 40 and substantially perpendicular to the main body of the buckle component 40, such that the fastening plate 42 is disposed in front of the main body 10 parallel to the front end surface of the main body 10 by a distance. Referring to FIG. 10, FIG. 11A and FIG. 11B, when the slide rail bracket 2 and the buckle component 40 are assembled on the rack column 50, the front of the rack column 50 can be blocked by the fastening plate 42. The fastening plate 42 is further provided with a fastening hole 421 which is substantially rectangular. The fastening hole 421 can be used with a hook 61 of a locking device 60. The locking device 60 is installed at an end of a movable rail of the slide rail 1. When the movable rail of the slide rail 1 retracts back into the inside thereof, the hook 61 of the locking device 60 engages into the fastening hole 421 so that the locking device 60 and the fastening plate 42 are combined together.

[Beneficial Effects of the Present Disclosure]

The beneficial effects of the present disclosure are as follows:

1. The slide rail bracket 2 can be applied to the rack column 50 having positioning holes in different sizes at the same time and has a changeable buckle component 40. Therefore, the slide rail bracket 2 of the present disclosure can be used with slide rail locking mechanisms of different types and its convenience of use can be effectively improved.

2. When detaching the slide rail bracket 2 of the present disclosure, the operator only needs to toggle the toggle portion 213 to detach the positioning bolts 22 from the positioning holes 51a and 51b of the rack column 50. Therefore, the slide rail bracket 2 of the present disclosure can be removed without using tools and its convenience of use can be effectively enhanced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A slide rail bracket used to be installed on a slide rail to fix the slide rail onto a rack column of a rack, comprising:
a main body including a front end and a rear end, an accommodating portion provided inside, two through holes disposed at the front end of the main body, wherein the two through holes are parallel to each other and extend from the front end thereof to the accommodating portion;
a slide component including a slide block and two positioning bolts, wherein the slide block is slidably disposed in the accommodating portion and is slidable back and forth along a direction parallel to the two through holes; the two positioning bolts are disposed on the front end of the slide block and respectively penetrate into the two through holes; when the slide block is moved near the front end of the main body, the two positioning bolts protrude from the outer side of the front end of the main body;
a first diameter portion and a second diameter portion respectively provided at the front end of the two positioning bolts, wherein the first diameter portion and the second diameter portion are coaxial with each other, and the diameter of first diameter portion is smaller than the diameter of second diameter portion, and the first diameter portion is disposed at the front end of second diameter portion; and
at least one elastic member disposed between the accommodating portion and the slide block, and used to push the slide block to move toward the front of the main body;
wherein a toggle portion is provided on a side surface of the slide block, an opening portion is disposed on a side of the main body corresponding to the toggle portion, and the toggle portion is exposed from the opening portion so that the slide component is capable of being moved by toggling the toggle portion through the opening portion;
wherein the two positioning bolts are detachably disposed on the slide block, the front end of the slide block has two connecting plates substantially perpendicular to the two positioning bolts, the rear ends of the two positioning bolts are respectively provided with a connecting slot corresponding to the positions of two connecting plates, and the widths of two connecting slots complement the two connecting plates so that the two connecting plates engage in the two connecting slots to combine the two positioning bolts on the front end of the slide block.

2. The slide rail bracket according to claim 1, wherein a positioning slot is respectively disposed in the two connecting slots, a positioning portion is further disposed on the two connecting plates corresponding to the position of positioning slot, the two positioning slots and the two positioning portions extend in a direction substantially perpendicular to the extending direction of the two connecting slots, and when the two connecting slots are engaged with the two connecting plates, the two positioning portions are engaged in the two positioning slots to prevent the two connecting plates from being disengaged from the two connecting slots.

3. The slide rail bracket according to claim 1, wherein a side surface of the main body is disposed with a cover plate, the rear end of the cover plate is connected to a connecting seat, and the main body is fixed at the front end or rear end of the slide rail through the connecting seat.

4. The slide rail bracket according to claim 1, further including a buckle component, wherein the buckle component is disposed at a side surface of the main body and extends beyond the front end of the main body, a buckle slot is disposed at a side surface of the buckle component facing the rack column and corresponds in position to the rack column, and the buckle slot is engaged at a side surface of the rack column when the slide rail bracket is assembled on the rack column to fixedly position the slide rail bracket.

5. The slide rail bracket according to claim 4, wherein the buckle component is fixed to the main body by screws such that the buckle component is detachably installed on the main body.

6. The slide rail bracket according to claim 5, wherein the buckle component has a fastening plate disposed at the front end of the buckle component that is substantially perpendicular to the buckle component, and that is provided with a fastening hole thereon used to be engaged with a hook of a locking device disposed on the slide rail.

7. The slide rail bracket according to claim 1, wherein a locking bolt hole is disposed between the two through holes at the front end of the main body.

8. A slide rail bracket used to be installed on a slide rail to fix the slide rail onto a rack column of a rack, comprising:
- a main body including a front end and a rear end, an accommodating portion provided inside, two through holes disposed at the front end of the main body, wherein the two through holes are parallel to each other and extend from the front end thereof to the accommodating portion;
- a slide component including a slide block and two positioning bolts, wherein the slide block is slidably disposed in the accommodating portion and is slidable back and forth along a direction parallel to the two through holes; the two positioning bolts are disposed on the front end of the slide block and respectively penetrate into the two through holes; when the slide block is moved near the front end of the main body, the two positioning bolts protrude from the outer side of the front end of the main body;
- a first diameter portion and a second diameter portion respectively provided at the front end of the two positioning bolts, wherein the first diameter portion and the second diameter portion are coaxial with each other, and the diameter of first diameter portion is smaller than the diameter of second diameter portion, and the first diameter portion is disposed at the front end of second diameter portion;
- at least one elastic member disposed between the accommodating portion and the slide block, and used to push the slide block to move toward the front of the main body; and
- a buckle component, wherein the buckle component is disposed at a side surface of the main body and extends beyond the front end of the main body, a buckle slot is disposed at a side surface of the buckle component facing the rack column and corresponds in position to the rack column, and the buckle slot is engaged at a side surface of the rack column when the slide rail bracket is assembled on the rack column to fixedly position the slide rail bracket.

9. The slide rail bracket according to claim 8, wherein the buckle component is fixed to the main body by screws such that the buckle component is detachably installed on the main body.

10. The slide rail bracket according to claim 9, wherein the buckle component has a fastening plate disposed at the front end of the buckle component that is substantially perpendicular to the buckle component, and that is provided with a fastening hole thereon used to be engaged with a hook of a locking device disposed on the slide rail.

* * * * *